(12) United States Patent
Hwang et al.

(10) Patent No.: US 9,024,846 B2
(45) Date of Patent: May 5, 2015

(54) PIXEL AND ORGANIC LIGHT EMITTING DISPLAY DEVICE USING THE SAME

(75) Inventors: Young-In Hwang, Yongin (KR); Chul-Kyu Kang, Yongin (KR); Seong-Il Park, Yongin (KR); Yong-Sung Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 943 days.

(21) Appl. No.: 12/987,892

(22) Filed: Jan. 10, 2011

(65) Prior Publication Data

US 2011/0310077 A1    Dec. 22, 2011

(30) Foreign Application Priority Data

Jun. 21, 2010   (KR) ................ 10-2010-0058492

(51) Int. Cl.
  *G09G 3/32*   (2006.01)
  *H01L 27/32*  (2006.01)

(52) U.S. Cl.
  CPC ............ *G09G 3/3233* (2013.01); *G09G 3/3208* (2013.01); *H01L 27/3244* (2013.01); *G09G 2300/0861* (2013.01); *G09G 2310/0251* (2013.01); *G09G 2320/045* (2013.01)

(58) Field of Classification Search
  USPC .......................................................... 345/30
  See application file for complete search history.

(56) References Cited

U.S. PATENT DOCUMENTS

| | | | |
|---|---|---|---|
| 2005/0017934 A1 | 1/2005 | Chung et al. | |
| 2006/0038754 A1 | 2/2006 | Kim | |
| 2007/0118781 A1* | 5/2007 | Kim | 714/727 |
| 2008/0150844 A1 | 6/2008 | Choi | |
| 2009/0201231 A1 | 8/2009 | Takahara et al. | |
| 2011/0025586 A1 | 2/2011 | Lee | |
| 2011/0025671 A1 | 2/2011 | Lee | |

FOREIGN PATENT DOCUMENTS

| | | |
|---|---|---|
| JP | 2006-106568 | 4/2006 |
| KR | 10-2005-0005646 | 1/2005 |
| KR | 10-2007-0083072 | 8/2007 |
| KR | 10-2010-0071301 | 6/2010 |

OTHER PUBLICATIONS

KIPO Office Action dated Nov. 9, 2011 in KR application 10-2010-0058492, 4 pages.
KIPO Office Action dated Apr. 30, 2012, for Korean priority Patent application 10-2010-0058492, (1 page).
U.S. Office action dated Mar. 1, 2012, for cross reference U.S. Appl. No. 12/987,026, (10 pages).

* cited by examiner

*Primary Examiner* — Amare Mengistu
*Assistant Examiner* — Shawna Stepp Jones
(74) *Attorney, Agent, or Firm* — Christie, Parker & Hale, LLP

(57) ABSTRACT

A pixel has a simple structure and compensates for a threshold voltage of a driving transistor. An organic light emitting display device includes the pixel, which includes: an organic light emitting diode; a first transistor having a second electrode coupled to the organic light emitting diode and a first electrode coupled to a data line; a second transistor between a gate electrode and the second electrode of the first transistor and turned on when a scan signal is supplied to a scan line; and a storage capacitor electrically coupled between the gate electrode of the first transistor and a first power supply.

25 Claims, 11 Drawing Sheets

PIXEL AND ORGANIC LIGHT EMITTING DISPLAY DEVICE USING THE SAME

CROSS-REFERENCE TO RELATED APPLICATIONS

This application claims priority to and the benefit of Korean Patent Application No. 10-2010-0058492, filed on Jun. 21, 2010, in the Korean Intellectual Property Office, the entire content of which is incorporated herein by reference.

BACKGROUND

1. Field

An embodiment relates to a pixel and an organic light emitting display device including the pixel.

2. Description of Related Art

Recently, a variety of flat panel displays that makes it possible to reduce the weight and the volume in comparison to cathode ray tubes, have been developed. Typical flat panel displays include liquid crystal displays, field emission displays, plasma display panels, and organic light emitting display devices, etc.

The organic light emitting display device displays an image, using organic light emitting diodes that produce light by recombining electrons and holes. The organic light emitting display device has high response speed and is driven with low power consumption.

FIG. 1 is a circuit diagram illustrating a pixel of an organic light emitting display device in the related art.

Referring to FIG. 1, a pixel 4 of an organic light emitting display device of the related art includes: an organic light emitting diode OLED; and a pixel circuit 2 connected with a data line Dm and a scan line Sn and controlling the organic light emitting diode OLED.

The anode electrode of the organic light emitting diode OLED is connected to the pixel circuit 2 and the cathode electrode is connected to the second power supply ELVSS. The organic light emitting diode produces light with predetermined luminance in response to the current supplied from the pixel circuit 2.

The pixel circuit 2 controls the amount of current supplied to the organic light emitting diode OLED, in response to a data signal supplied to the data line Dm, when a scan signal is supplied to the scan line Sn. For this configuration, the pixel circuit 2 includes: a second transistor M2 connected between a first power supply ELVDD and the organic light emitting diode OLED; a first transistor M1 coupled to the second transistor M2, the data line Dm, and the scan line Sn; and a storage capacitor Cst connected between a gate electrode and a first electrode of the second transistor M2.

A gate electrode of the first transistor M1 is connected to the scan line Sn and a first electrode of the first transistor M1 is connected to the data line Dm. Further, a second electrode of the first transistor M1 is connected to one terminal of the storage capacitor Cst. In this configuration, the first electrode is one of a source electrode and a drain electrode and the second electrode is the other electrode different from the first electrode. For example, when the first electrode is the source electrode, the second electrode is the drain electrode. The first transistor M1 connected to the scan line Sn and the data line Dm is turned on and supplies a data signal, which is supplied through the data line Dm, to the storage capacitor Cst. In this operation, the storage capacitor Cst is charged with a voltage corresponding to the data signal.

The gate electrode of the second transistor M2 is connected to one terminal of the storage capacitor Cst and the first electrode of the second transistor M2 is connected to the first power supply ELVDD and the other terminal of the storage capacitor Cst. Further, the second electrode of the second transistor M2 is connected to the anode of the organic light emitting diode OLED. The second transistor M2 controls the amount of current flowing from the first power supply ELVDD to the second power supply ELVSS through the organic light emitting diode OLED, in accordance with the voltage value stored in the storage capacitor Cst. In this configuration, the organic light emitting diode OLED emits light corresponding to the amount of current supplied from the second transistor M2.

However, the pixel 4 of the organic light emitting display device of the related art may not display an image with uniform luminance. To be more specific, the second transistors M2 (i.e., driving transistor) in the pixels 4 have different threshold voltages for each pixel 4 due to process variation during manufacturing. As the threshold voltages of the driving transistors are different, light with different luminance is generated by the difference in the threshold voltage of the driving transistors, even if data signals corresponding to the same gradation are supplied to the pixels 4.

In order to overcome the problems, a structure additionally forming a transistor in each pixel 4 to compensate for the threshold voltage of the driving transistor has been disclosed. Practically, a structure using six transistors and one capacitor for each pixel 4 to compensate for the threshold voltage of a driving transistor has been disclosed (Korean Patent Publication No. 2007-0083072). However, the six transistors included in the pixel 4 complicate the pixel 4. In particular, the possibility of malfunction is increased and yield is correspondingly decreased by the transistors in the pixels.

SUMMARY OF THE INVENTION

An aspect of an embodiment is directed toward a pixel having a simple structure and compensating for the threshold voltage of a driving transistor, and an organic light emitting display device using the pixel.

According to an embodiment of the present invention, there is provided a pixel including: an organic light emitting diode; a first transistor having a second electrode electrically coupled to the organic light emitting diode and a first electrode electrically coupled to a data line; a second transistor between a gate electrode and the second electrode of the first transistor and configured to be turned on when a scan signal is supplied to a scan line; and a storage capacitor electrically coupled between the gate electrode of the first transistor and a first power supply.

The pixel may further include a third transistor between the first power supply and the data line and configured to be turned on while current is supplied to the organic light emitting diode. The pixel may further include a fourth transistor between the data line and the first transistor and configured to be turned on concurrently with the second transistor while the storage capacitor is being charged.

According to another embodiment of the present invention, there is provided an organic light emitting display device that operates in a frame period including an initializing period, a scan period, and an emission period, and includes: a display unit including pixels coupled with first scan lines and data lines; a data driver for driving output lines; a first power driver supplying a first power that varies between a high level and a low level to a first power line and a second power line electrically coupled with the pixels; connecting units positioned between the output lines and the data lines and connecting the data lines with any one of the first power line and the output lines; and a second power driver for supplying a second power that varies between a low level and a high level to the pixels, wherein each of the pixels includes: a first transistor having a second electrode electrically coupled with the organic light emitting diode and a first electrode electrically coupled with a corresponding one of the data lines; a second transistor between a gate electrode and the second electrode of the first transistor and configured to be turned on when a scan signal is supplied to a corresponding one of the first scan lines; and a storage capacitor electrically coupled between the gate electrode of the first transistor and the first power driver.

The second power driver may be configured to supply a voltage at a high level for the initializing period and the scan period, and to supply a voltage at a low level for the emission period. The organic light emitting display device may further include a scan driver configured to concurrently supply the first scan signals to the first scan lines for a period of the initializing period. Each of the connecting unit may include: a first control transistor between a corresponding one of the output lines and a corresponding one of the data lines and configured to be turned on when a first control signal is supplied; and a second control transistor between the first power line and the corresponding one of the data lines and configured to be turned on when a second control signal is supplied. The first control transistor and the second control transistor may be alternately turned on and off.

The organic light emitting display device may further include a control signal generator for supplying the second control signals for the initializing period and the emission period, and alternately supplying the first control signals and the second control signals for the scan period. The scan period may include a plurality of horizontal periods, the second control signals are supplied for a first half period of the horizontal periods, and the first control signals are supplied for a second half period, except for the first half period. The organic light emitting display device may further include a scan driver for supplying the first scan signals to the first scan lines in synchronization with the first control signals for the scan period. The first power driver may be configured to supply a voltage of a low level for the initializing period, to supply a voltage of a low level for the emission period, to supply voltage of a low level for the first half period of the scan period, and to supply a voltage of a high level for the second half period. The data driver may be configured to supply data signals to the data lines in synchronization with the first control signals. The organic light emitting display device may further include a control signal generator for supplying the second control signals for the initializing period and the emission period, and for supplying the first control signals for the scan period.

The first power driver may be configured to supply a voltage at a low level for the initializing period, and to supply a voltage at a high level for the scan period and the emission period. The scan period may further include a plurality of horizontal periods, and the organic light emitting display device may further include a scan driver for supplying the first scan signals for a second half period of the horizontal periods. The data driver may be configured to supply data signals to the data lines for the second half period of the horizontal period and to supply an initialization power to the data lines for the first half period before the second half period. The initialization power supply may be set at a voltage lower than a voltage of the data signals. Each of the pixels may further include a third transistor between the first power line and the data line. The third transistor may be configured to be turned on for the emission period. Each of the pixels may further include a fourth transistor between the data line and the first transistor and configured to be turned on when a second scan signal is supplied to the second scan line. The scan driver may supply the second scan signals to the second scan lines for the initializing period and the emission period. The scan driver may sequentially supply the first scan signals and the second scan signals to the first scan lines and the second scan lines for the scan period. The pixels each further may include a third transistor between the first power line and the data line. The third transistor may be configured to be turned on for the initializing period and the emission period.

According to a pixel according to the present invention and an organic light emitting display device using the pixel, it is possible to compensate threshold voltage of a driving transistor while minimizing the number of transistors included in the pixel.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
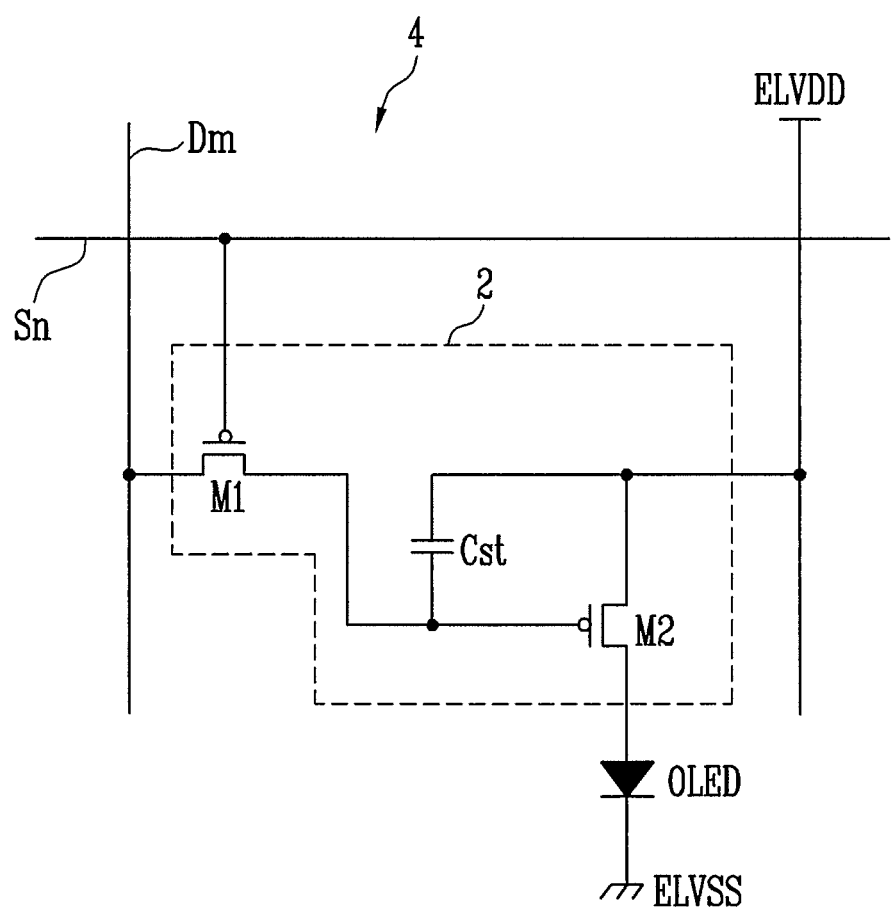
FIG. 1 is a circuit diagram illustrating a pixel of an organic light emitting display device in the related art.

Hereinafter, certain exemplary embodiments according to the present invention will be described with reference to the accompanying drawings. Here, when a first element is described as being coupled to a second element, the first element may be directly coupled to the second element or may be indirectly coupled to the second element via a third element. Further, some of the elements that are not essential to a complete understanding of the invention are omitted for clarity. Also, like reference numerals refer to like elements throughout.

Exemplary embodiments of the present invention are described in detail with reference to FIGS. 2 to 11.

Figure 2:
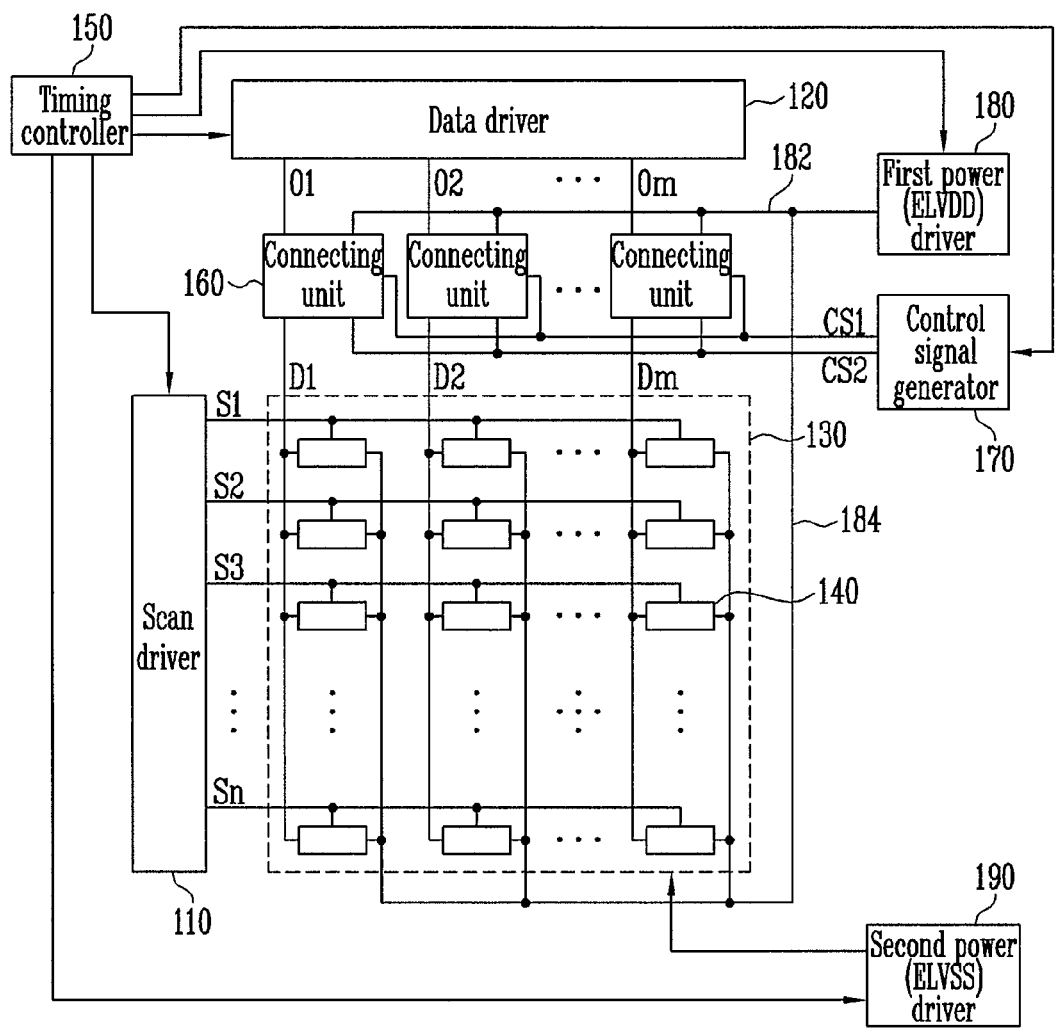
FIG. 2 is a diagram illustrating an organic light emitting display device according to an embodiment of the present invention.

FIG. 2 is a block diagram illustrating an organic light emitting display device according to an embodiment of the present invention.

Referring to FIG. 2, an organic light emitting display device according to an embodiment of the present invention includes a display unit 130 including pixels 140 coupled with scan lines S1 to Sn and data lines D1 to Dm, a scan driver 110 for supplying scan signals to the scan lines S1 to Sn, and a data driver 120 for supplying data signals to output lines O1 to Om.

Further, the organic light emitting display device according to an embodiment of the present invention includes connecting units 160 formed between the output lines O1 to Om and the data lines D1 to Dm, a first power driver 180 for supplying a first power ELVDD to a first power line 182 and a second power line 184, a second power driver 190 for supplying a second power ELVSS to the pixels 130, a control signal generator 170 for supplying control signals to the connecting units 160, and a timing controller 150 for controlling the scan driver 110, the data driver 120, the control signal generator 170, the first power driver 180, and the second power driver 190.

The scan driver 110 supplies scan signals to the scan lines S1 to Sn. In this configuration, the scan driver 110 sequentially or concurrently (e.g., simultaneously) supplies scan signals to the scan lines S1 to Sn for one frame period.

The data driver 120 supplies data signals to the data lines D1 to Dm in synchronization with the scan signals sequentially supplied to the scan lines S1 to Sn. Additionally, it is possible to supply an initialization power having a voltage that is lower than a voltage of the data signals to the data lines D1 to Dm, before supplying the data signals to the data driver 120. This will be described below in detail with reference to driving waveforms.

The first power driver 180 supplies the first power ELVDD to the first power line 182 and the second power line 184. In this configuration, the first power driver 170 supplies power, which repeats a high level and a low level (e.g., varies or alternates between the high level and the low level), of the first power supply ELVDD for each of the fame period. The high-level first power ELVDD is set to a voltage that allows for a current to flow in the pixel 140 (e.g., a voltage higher than that of a data signal) and the low-level first power ELVDD is set to voltage that does not allow for a current to flow in the pixel 140 (e.g., a voltage lower than that of the data signal).

The first power line 182 is located between the connecting unit 160 and the first power driver 180. The first power line 182 transmits voltage of the first power supply ELVDD to the connecting unit 160.

The second power line 184 is located between the pixels 140 and the first power driver 180. The second power line 184 supplies the voltage of the first power supply ELVDD to the pixels 140, not through the connecting units 160.

The second power driver 190 supplies power of the second power supply ELVSS to the pixels 140. In this configuration, the second power driver 190 supplies power, which repeats a high level and a low level (e.g., the power varies or alternates between the high level and the low level), of the second power supply ELVSS for each of the frame periods. The high-level second power ELVSS is set to a voltage that does not allow for a current to flow in the pixel 140 (e.g., a voltage higher than that of a data signal) and the low-level second power ELVSS is set to voltage that allows for a current to flow in the pixel 140 (e.g., a voltage lower than that of the data signal). In practice, the pixels 140 emit light only for the emission period where the first power supply ELVDD is set at the high level and the second power supply ELVSS is set at the low level in one frame period.

The control signal generator 170 generates and supplies a first control signal CS1 and a second control signal CS2 to the connecting units 160.

The connecting unit 160 is formed in each of the output lines O1 to Om and coupled with a corresponding one of the data lines D1 to Dm. The connecting units 160 selectively electrically couple the data lines D1 to Dm with the output lines O1 to Om or the first power line 182, in response to the first control signal CS1 and the second control signal CS2.

The display unit 130 has the pixels 140 positioned at crossing regions of the scan lines S1 to Sn and the data lines D1 to Dm. The pixels 140 are supplied with power from the first power supply ELVDD and the second power supply ELVSS. The pixels 140 control the amount of current supplied to the second power supply ELVSS through organic light emitting diodes from the first power supply ELVDD, in accordance with the data signals, for the emission period in one frame period. Accordingly, light (e.g., light having a predetermined luminance) is generated in the organic light emitting diode.

Figure 3:
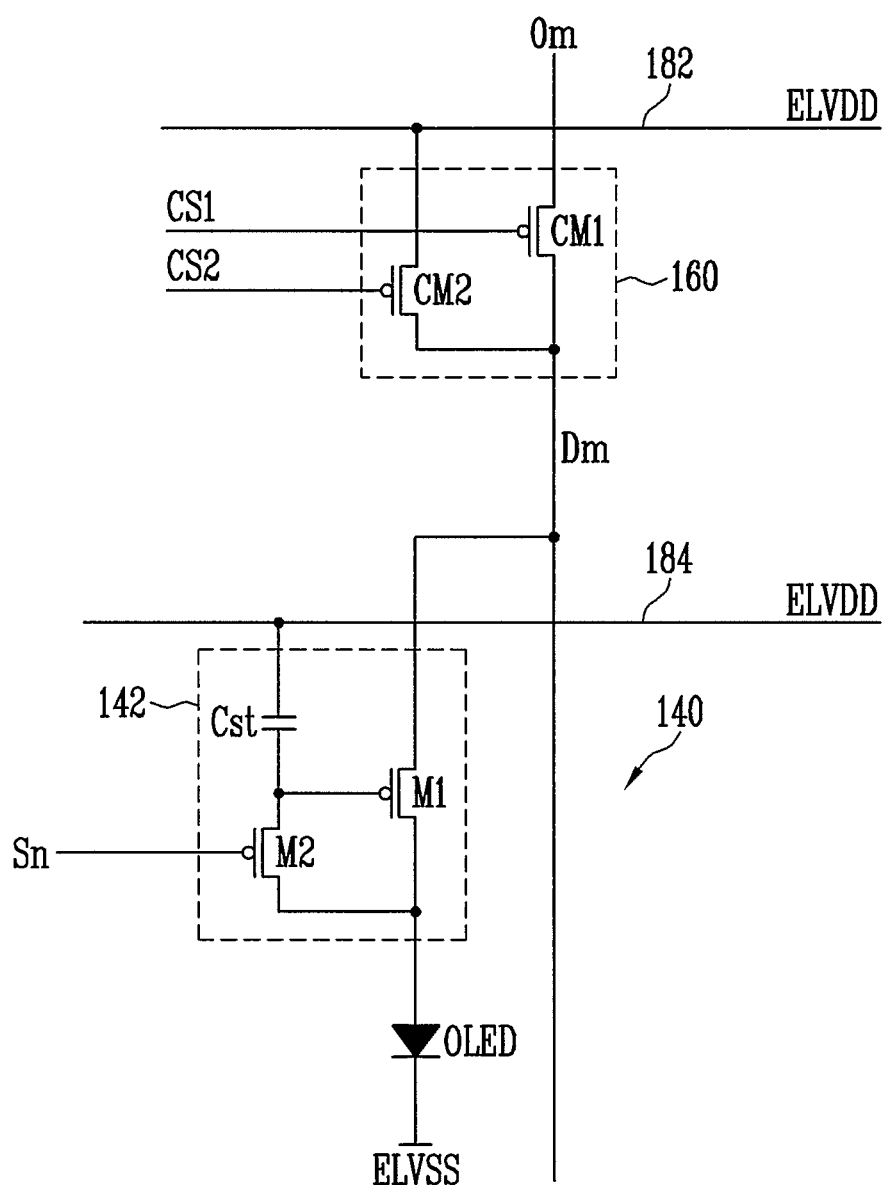
FIG. 3 is a circuit diagram showing an embodiment of the connecting units and the pixels according to a first embodiment of the present invention.

FIG. 3 is a circuit diagram showing an embodiment of the connecting units and the pixels according to a first embodiment of the present invention. FIG. 3 shows the connecting unit 160 connected with the m-th output line Om and the pixel 140 connected with the n-th scan line Sn, for the convenience of description.

Referring to FIG. 3, the connecting unit 160 according to the first embodiment of the present invention includes a first control transistor CM1 and a second control transistor CM2.

The first control transistor CM1 is located between the output line Om and the data line Dm. The first control transistor CM1 is turned on when the first control signal is supplied.

The second control transistor CM2 is located between the first power line 182 and the data line Dm. The second control transistor CM2 is turned on when the second control signal is supplied. In this configuration, the first control transistor CM1 and the second control transistor CM2 electrically couple the data line Dm to the first power line 182 or the output line Om while being alternately turned on.

Each of the pixels 140 according to an embodiment of the present invention has an organic light emitting diode OLED and a pixel circuit 142 for controlling the amount of current supplied to the organic light emitting diode OLED.

The anode electrode of the organic light emitting diode OLED is electrically coupled to the pixel circuit 142 and the cathode electrode is electrically coupled to the second power supply ELVSS. The organic light emitting diode OLED produces light (e.g., light with a predetermined luminance) in response to the current supplied from the pixel circuit 142.

The pixel circuit 142 is charged at a voltage corresponding to the data signal and the threshold voltage of the driving transistor, and controls the amount of current supplied to the organic light emitting diode OLED on the basis of (e.g., in accordance with) the charged voltage. For this operation, the pixel circuit 140 includes first and second transistors M1 to M2 and a storage capacitor Cst.

The first electrode of the first transistor M1 is electrically coupled to the data line Dm and the second electrode is electrically coupled to the anode electrode of the organic light emitting diode OLED. Further, a gate electrode of the first transistor M1 is electrically coupled to a first terminal of the storage capacitor Cst. The first transistor M1 controls the amount of current supplied to the organic light emitting diode in response to the voltage charged in the storage capacitor Cst.

A first electrode of the second transistor M2 is electrically coupled to a second electrode of the first transistor M1 and a second electrode of the second transistor M2 is electrically coupled to a first terminal of the storage capacitor Cst. Further, a gate electrode of the second transistor M2 is electrically coupled to the scan line Sn. The second transistor M2 is turned on to diode-connect (or diode-couple) the first transistor M1 when a scan signal is supplied to the scan line Sn.

The storage capacitor Cst is electrically coupled between the gate electrode of a first transistor M1 and the second power line 184. In this operation, the storage capacitor Cst is charged with a voltage corresponding to a data signal and a threshold voltage of the first transistor M1.

Figure 4:
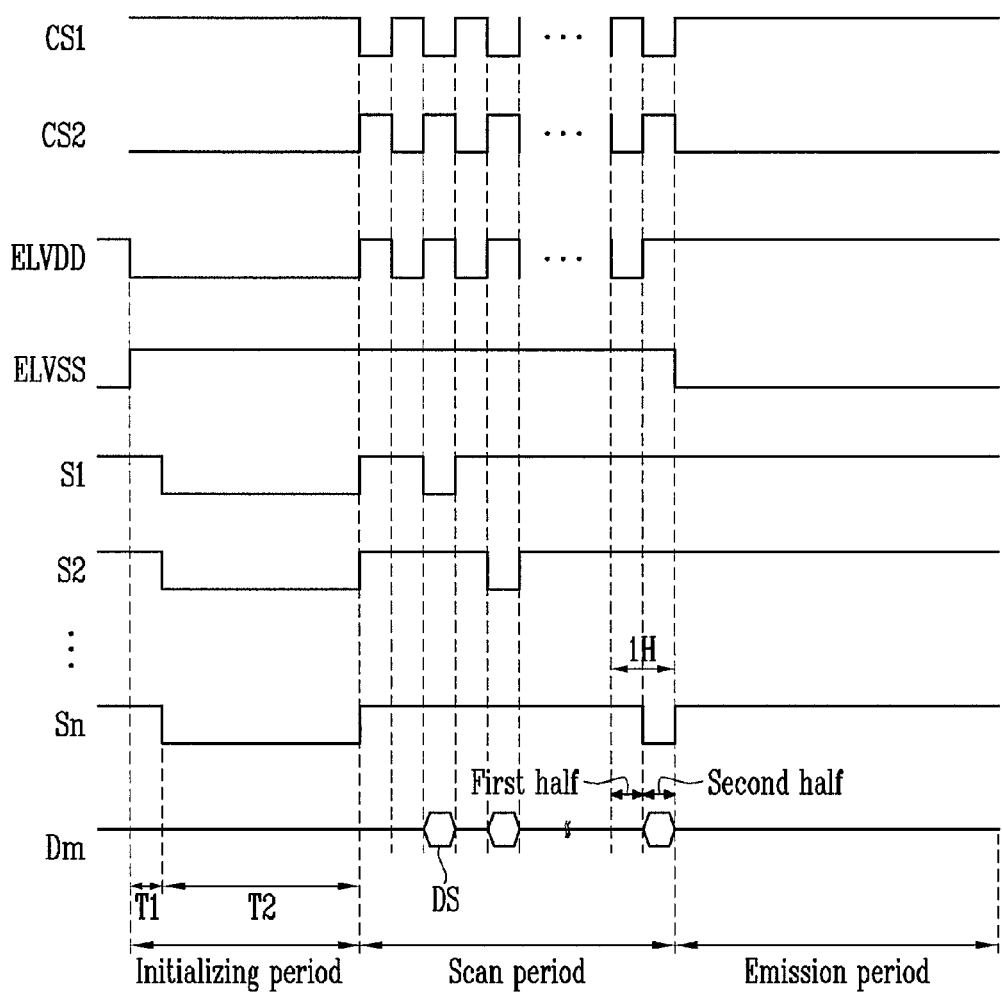
FIG. 4 is a waveform diagram illustrating a driving method according to a first embodiment of the connecting unit and pixel shown in FIG. 3.

FIG. 4 is a waveform diagram illustrating a driving method according to a first embodiment of the connecting unit and pixel shown in FIG. 3.

Referring to FIG. 4, one frame period is divided into an initializing period (or an initialization period), a scan period, and an emission period in described embodiments of the present invention.

The initializing period is divided into a first period T1 and a second period T2. The voltage of the anode electrode of the organic light emitting diode OLED is initialized for (e.g., during) the first period T1 and the gate electrode of the first transistor M1 is initialized for (e.g., during) the second period T2.

The storage capacitor Cst in each of the pixels 140 is charged with a voltage corresponding to a data signal and a threshold voltage of the first transistor M1 for (e.g., during) the scan period. Since the second power supply ELVSS is set to a high level for (e.g., during) the initializing period and the scan period, the light is not emitted through the pixels 140.

The pixels 140 control the amount of current supplied to the organic light emitting diode OLED in response to the voltage charged in the storage capacitors Cst for (e.g., during) the emission period.

Describing the operation in detail with reference to FIGS. 3 and 4, the second power supply ELVSS is set to a high level and the first power supply ELVDD is set to a low level for (e.g., during) the initializing period. Further, a second control signal CS2 is supplied and the second control transistor M2 is turned on for (e.g., during) the first period T1, such that the data line Dm and the first power line 182 are electrically coupled to each other. The voltage of the anode electrode of the organic light emitting diode OLED becomes higher than the voltage of the first power line 182, such that the voltage at the anode electrode of the organic light emitting diode OLED drops substantially to the voltage of the low-level first power supply ELVDD.

Scan signals are supplied to the scan lines S1 to Sn for (e.g., during) a second period T2 of the initializing period. The second transistors M2 in the pixels 140 are turned on, when the scan signals are supplied to the scan lines S1 to Sn. As the second transistor M2 is turned on, the gate electrode of the first transistor M1 and the anode electrode of the organic light emitting diode OLED are electrically coupled to each other. In this process, the voltage at the gate electrode of the first transistor M1 drops to the voltage of the anode electrode of the organic light emitting diode OLED.

In detail, the voltage applied to the anode electrode for the first period T1 is stored in a parasitic capacitor of the organic light emitting diode OLED, which is not shown in the drawings. In this configuration, the parasitic capacitor of the organic light emitting diode OLED is set to have capacity larger than that of the storage capacitor Cst. Therefore, when the gate electrode of the first transistor M1 is electrically coupled with the anode electrode of the organic light emitting diode OLED for (e.g., during) the second period T2, the voltage at the gate electrode of the first transistor M1 drops substantially to the voltage of the anode electrode of the organic light emitting diode OLED.

Scan signals are sequentially supplied to the scan lines S1 to Sn for (e.g., during) the scan period. The horizontal period 1H in which scan signals can be supplied is divided into a first half (e.g., ½H period) and a second half (e.g., ½H period), and the scan signals are sequentially supplied for (e.g., during) the second half period. Further, the first control signal CS1 is supplied in the second half period of the horizontal period 1H in synchronization with the scan signals and the second control signal CS2 is supplied in the first half period of the horizontal period 1H. Further, the first power supply ELVDD is set to a low level for the first half period of the horizontal period 1H and a high level for the second half period, for the scan period.

The second signal CS2 is supplied and the second control transistor CM2 is turned on, before the first half period in which a scan signal is supplied to the n-th scan line Sn. As the second control transistor CM2 is turned on, the first control line 182 and the data line Dm are electrically coupled to each other. In this process, the voltage of the anode electrode of the organic light emitting diode OLED drops substantially to the voltage of the low-level first power supply ELVDD. The first half period of the horizontal period 1H is used to decrease the voltage of the anode electrode of the organic light emitting diode OLED that may have been increased by the previous data signal.

In detail, the data signals are supplied to the data lines D1 to Dm when the scan signals are supplied to the scan lines S1 to Sn. The data signals supplied to the data lines D1 to Dm are supplied to the pixels 140 connected to the respective data lines in vertical columns. For example, the data signal supplied to the m-th data line Dm in synchronization with the scan signal supplied to the first scan line S1 is also supplied to the pixel 140 electrically coupled with the n-th scan line Sn and the m-th data line Dm. In this case, an undesired data signal may be supplied to the anode electrode of the pixel 140 electrically coupled with the n-th scan line Sn and the m-th data line Dm. Therefore, in embodiments according to the present invention, the voltage of the anode electrode of the organic light emitting diode OLED is initialized for the first half period of the horizontal period 1H such that the storage capacitor Cst can be stably charged at a desired voltage.

A scan signal is supplied to the n-th scan line Sn and the second transistor M2 is turned on after the voltage of the anode electrode of the organic light emitting diode OLED is initialized. Further, the first control transistor CM1 is turned on and the data line Dm and the output line Om are electrically coupled with each other for (e.g., during) the second half period.

The first transistor M1 is diode-connected when the second transistor M2 is turned on. As the first control transistor CM1 is turned on, the data signal is supplied to the data line Dm. In this operation, since the voltage of the gate electrode of the first transistor M1 is lower than that of the data signal, the first transistor M1 is turned on. As the first transistor M1 is turned on, a voltage corresponding to the data signal and the threshold voltage of the first transistor M1 is applied to the gate electrode of the first transistor M1. The storage capacitor Cst is charged with the voltage corresponding to the data signal and the threshold voltage of the first transistor M1.

The second control transistor CM2 is turned on by the second control signal for (e.g., during) the emission period. Further, the first power supply ELVDD is set at a high level and the second power supply ELVSS is set at a low level for (e.g., during) the emission period. The first transistor M1 controls the amount of current flowing from the first power supply ELVDD to the second power supply ELVSS through the organic light emitting diode OLED, in response to the voltage stored in the storage capacitor Cst, for (e.g., during) the emission period.

Figure 5:
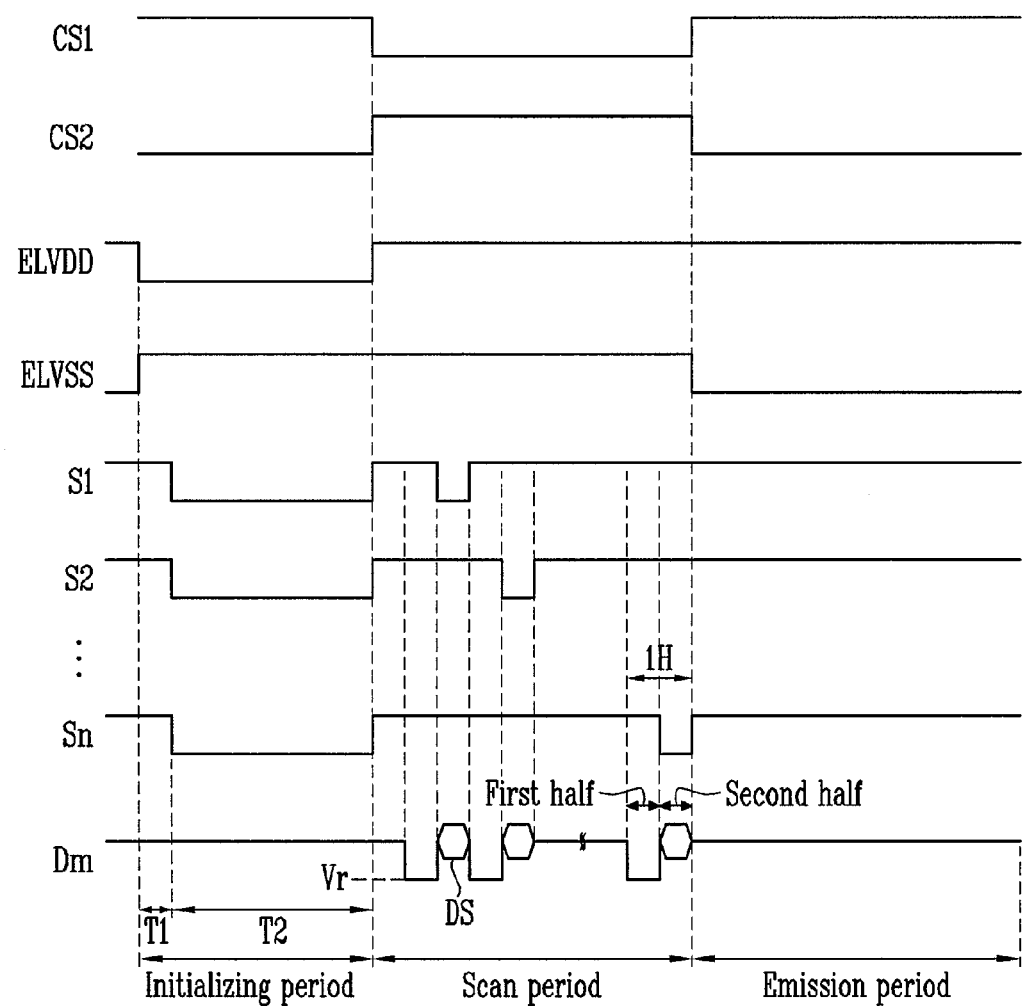
FIG. 5 is a waveform diagram illustrating a driving method according to a second embodiment of the connecting unit and pixel shown in FIG. 3.

FIG. 5 is a waveform diagram illustrating a driving method according to a second embodiment of the connecting unit and pixel shown in FIG. 3.

Referring to FIG. 5, the second power supply ELVSS is set to a high level and the first power supply ELVDD is set to a low level for (e.g., during) the initializing period. Further, a second control signal CS2 is supplied and the second control transistor CM2 is turned on for (e.g., during) the first period T1, such that the data line Dm and the first power line 182 are electrically coupled to each other. That is, the organic light emitting diode OLED is electrically coupled with the first power line 182, such that the voltage of the anode electrode of the organic light emitting diode OLED drops to the voltage of the low-level first power supply ELVDD, for (e.g., during) the first period T1.

Scan signals are supplied to the scan lines S1 to Sn for (e.g., during) the second period T2 of the initializing period. The second transistors M2 in the pixels 140 are turned on, when the scan signals are supplied to the scan lines S1 to Sn. As the second transistor M2 is turned on, the gate electrode of the first transistor M1 and the anode electrode of the organic light emitting diode OLED are electrically coupled to each other. In this process, the voltage at the gate electrode of the first transistor M1 drops substantially to the voltage of the anode electrode of the organic light emitting diode OLED.

Scan signals are sequentially supplied to the scan lines S1 to Sn for (e.g., during) the scan period. The 1H period in which the scan signals can be supplied is divided into a first half period and a second half period, and the scan signals are sequentially supplied for (e.g., during) the second half period. Further, the first control signals CS1 are supplied for (e.g., during) the scan period and the first control transistor CM1 is turned on. Further, an initial power Vr (or an initialization power) and a data signal are alternately supplied to the data lines D1 to Dm for (e.g., during) the scan period. The data signals DS are supplied for the second half period of the 1H period in synchronization with the scan signals and the initial power Vr is supplied for (e.g., during) the first half period of the 1H period. Further, the first power supply ELVDD is set to a high level for the scan period.

The initial power Vr is supplied to the output line Om for (e.g., during) the first half period before a scan signal is supplied to the n-th scan line Sn. The initial power Vr supplied to the output line Om is supplied to the data line Dm through the first control transistor CM1. In this process, the voltage of the anode electrode of the organic light emitting diode OLED drops substantially to the voltage of the initial power Vr. The voltage of the initial power Vr may be set to voltage lower than that of the data signal, for example, the same voltage as that of the low-level second power supply ELVSS.

Thereafter, a scan signal is supplied to the n-th scan line Sn and the second transistor M2 is turned on, while the data signal DS is supplied to the data line Dm. The first transistor M1 is diode-connected when the second transistor M2 is turned on. In this operation, since the voltage of the gate electrode of the first transistor M1 is set to the voltage of the initial power Vr, the first transistor M1 is turned on. As the first transistor M1 is turned on, voltage corresponding to the data signal and the threshold voltage of the first transistor M1 is applied to the gate electrode of the first transistor M1. The storage capacitor Cst is charged with a voltage corresponding to a data signal and the threshold voltage of the first transistor M1.

The second control transistor CM2 is turned on by the second control signal for (e.g., during) the emission period. Further, the second power supply ELVSS is set at a low level for (e.g., during) the emission period. The first transistor M1 controls the amount of current flowing from the first power supply ELVDD to the second power supply ELVSS through the organic light emitting diode OLED, in response to (e.g., in accordance with) the voltage stored in the storage capacitor Cst for (e.g., during) the emission period.

Figure 6:
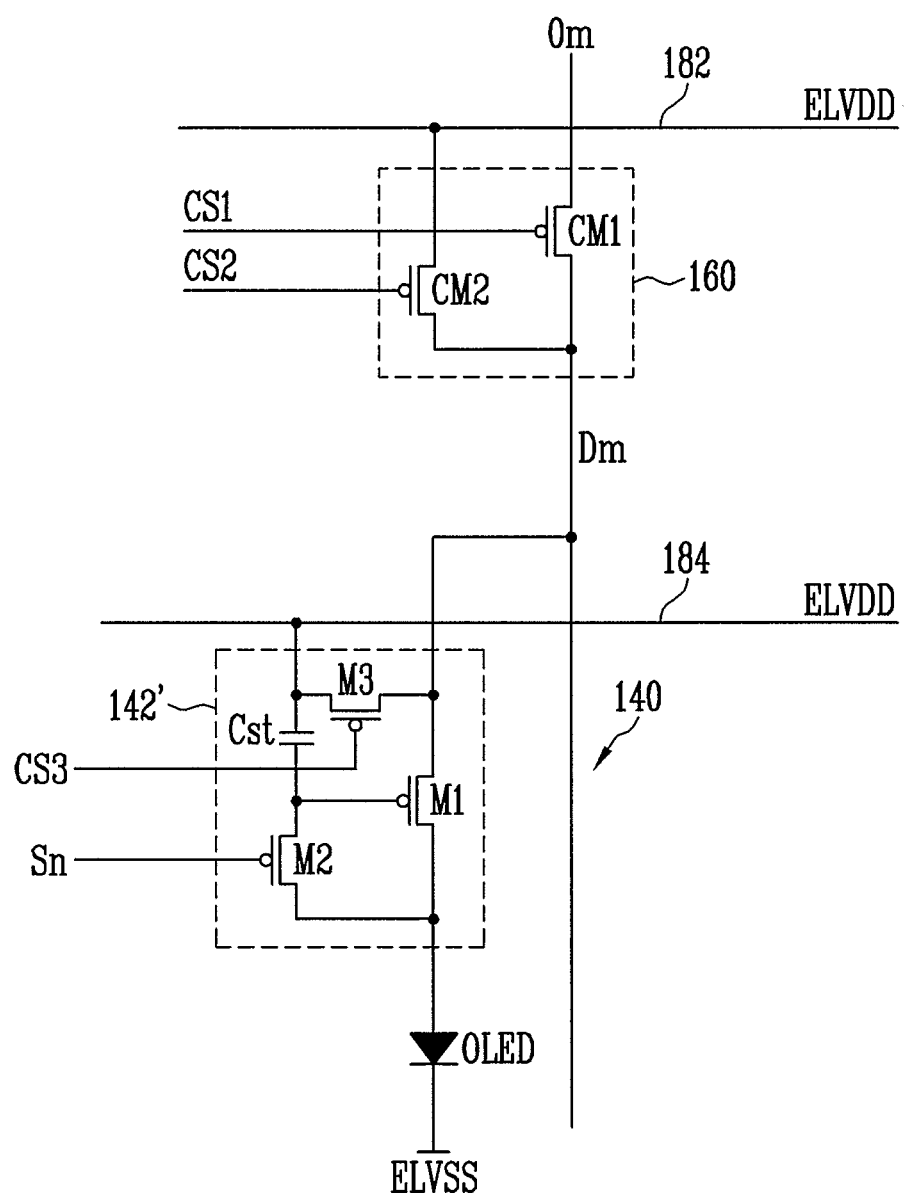
FIG. 6 is a circuit diagram showing an embodiment of the connecting units and the pixels according to the second embodiment of the present invention.

FIG. 6 is a circuit diagram illustrating a pixel according to a second embodiment of the present invention. For the convenience of explaining FIG. 6, the same components as in FIG. 3 are designated by the same reference numerals and the detailed description is not provided.

Referring to FIG. 6, the pixel 140 according to the second embodiment of the present invention includes an organic light emitting diode OLED and a pixel circuit 142' for controlling the amount of current supplied to the organic light emitting diode OLED.

The anode electrode of the organic light emitting diode OLED is electrically coupled to the pixel circuit 142' and the cathode electrode is electrically coupled to a second power supply ELVSS. The organic light emitting diode OLED produces light (e.g., light with predetermined luminance) in response to the current supplied from the pixel circuit 142'.

The pixel circuit 142' is charged with a voltage corresponding to the data signal and the threshold voltage of the driving transistor, and controls the amount of current supplied to the organic light emitting diode OLED on the basis of (e.g., in accordance with) the charge voltage. For this operation, the pixel circuit 140 includes first to third transistors M1 to M3 and a storage capacitor Cst.

The third transistor M3 is between a second terminal of the storage capacitor Cst and the first electrode of the first transistor M1. The third transistor having this configuration is supplied with a third control signal CS3 from the control signal generator 170. The third control signal CS3 is supplied for (e.g., during) the emission period and is not supplied for (e.g., during) the other periods, the initializing period and the scan period. In one embodiment, the third control signal CS3 is commonly supplied to the third transistors M3 in the pixels 140, such that the third transistors M3 may be electrically coupled in common to one control line transmitting the third control signal CS3.

Figure 7:
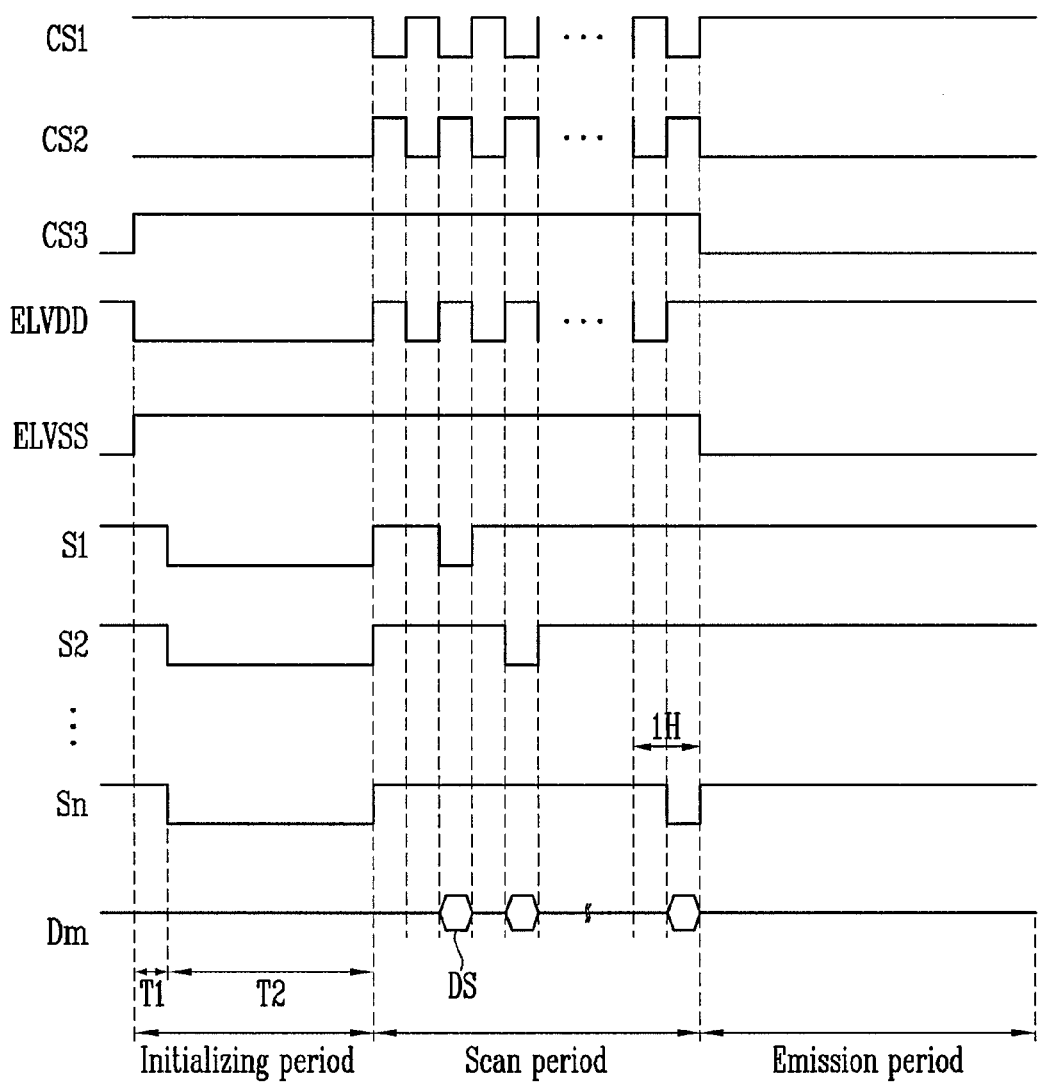
FIG. 7 is a waveform diagram illustrating a driving method according to a first embodiment of the connecting unit and pixel shown in FIG. 6.

FIG. 7 is a waveform diagram illustrating a driving method according to a first embodiment of the connecting unit and pixel shown in FIG. 6. The waveform shown in FIG. 7 is substantially the same as the waveform shown in FIG. 4, except for the third control signal CS3.

Referring to FIG. 7, the third transistor M3 is turned off for (e.g., during) the initializing period and the scan period. Therefore, the operation for (e.g., during) the initializing period and the scan period is substantially the same as that in the operation waveform shown in FIG. 4, and the detailed description is not provided.

Further, the third control signal CS3 is supplied and accordingly the third transistor M3 is turned on for (e.g., during) the emission period. As the third transistor M3 is turned on, a first terminal of the storage capacitor Cst, that is, the second power line 184 and the data line Dm are electrically coupled to each other. Further, the data line Dm is electrically coupled with the first power line 182 through the second control transistor CM2 for (e.g., during) the emission period. In this case the first control line 182 and the second control line 184 are electrically coupled for (e.g., during) the emission period, such that it is possible to reduce or minimize the voltage drop of the first power supply ELVDD.

In other words, when the first power line 182 and the second power line 184 are electrically coupled to each other, the resistance is reduced or minimized, and accordingly, it is possible to reduce or minimize the voltage drop of the first power supply ELVDD. In one embodiment, the first transistor M1 controls the amount of current flowing from the first power supply ELVDD to the second power supply ELVSS through the organic light emitting diode OLED, in response to the voltage stored in the storage capacitor Cst for (e.g., during) the emission period.

Figure 8:
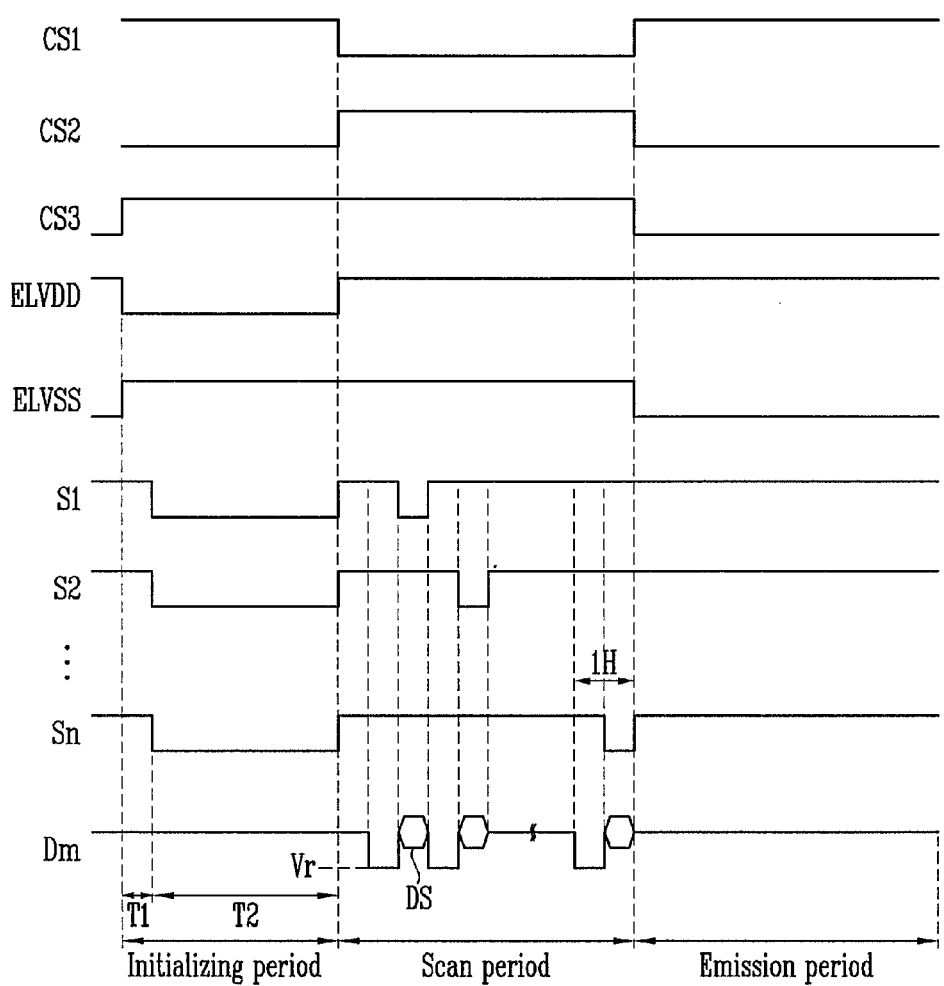
FIG. 8 is a waveform diagram illustrating a driving method according to the second embodiment of the connecting unit and pixel shown in FIG. 6.

FIG. 8 is a waveform diagram illustrating a driving method according to the second embodiment of the connecting unit and pixel shown in FIG. 6. The waveform shown in FIG. 8 is substantially the same as the waveform shown in FIG. 5, except for the third control signal CS3.

Referring to FIG. 8, the third transistor M3 is turned off for (e.g., during) the initializing period and the scan period. Therefore, the operation for the initializing period and the scan period is substantially the same as that in the operation waveform shown in FIG. 5, and the detailed description is not provided.

Further, the third control signal CS3 is supplied and accordingly the third transistor M3 is turned on for (e.g., during) the emission period. As the third transistor M3 is turned on, the first control line 182 and the second control line 184 are electrically coupled to each other, such that it is possible to reduce or minimize the voltage drop of the first power supply ELVDD.

In one embodiment, the first transistor M1 controls the amount of current flowing from the first power supply ELVDD to the second power supply ELVSS through the organic light emitting diode OLED, in response to the voltage stored in the storage capacitor Cst, for (e.g., during) the emission period.

Figure 9:
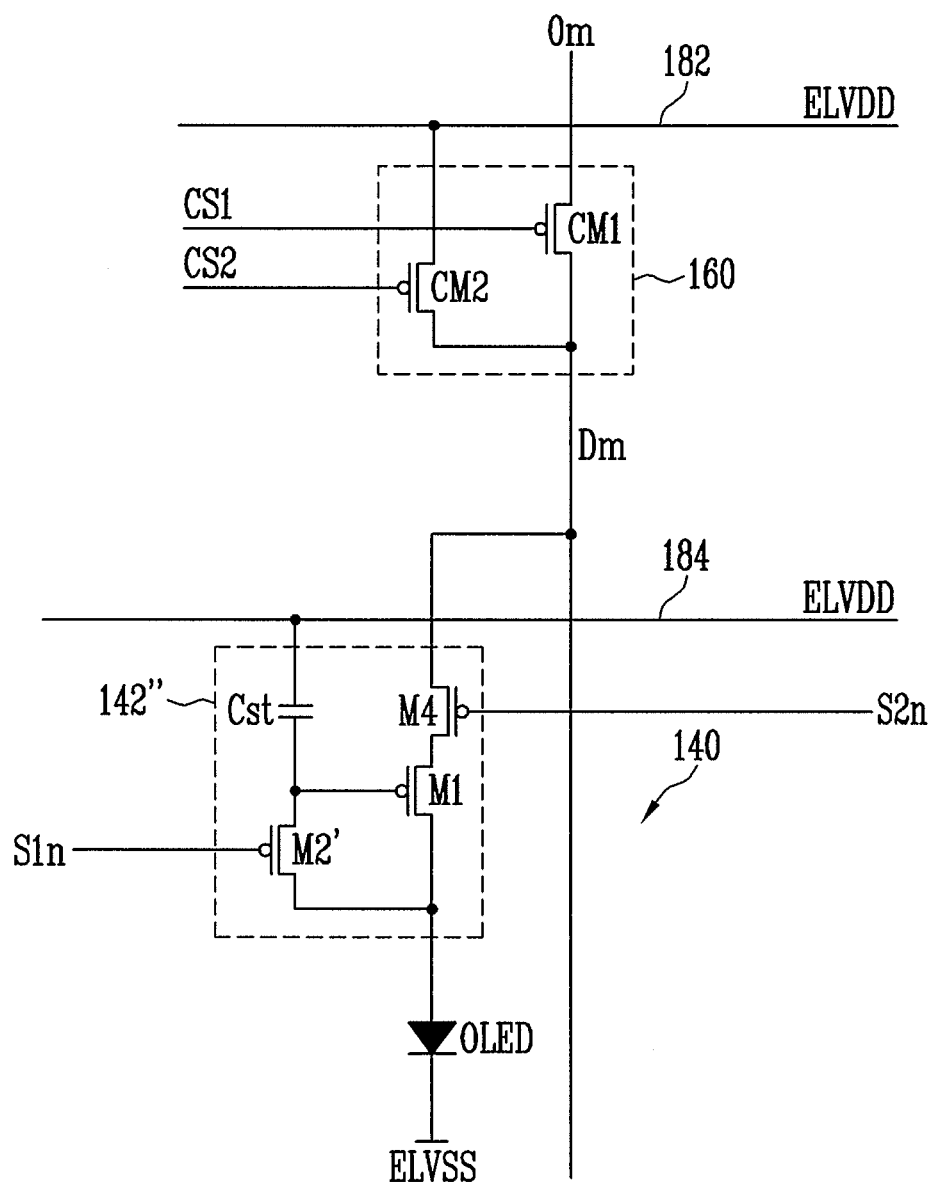
FIG. 9 is a circuit diagram showing an embodiment of the connecting units and the pixels according to a third embodiment of the present invention.

FIG. 9 is a circuit diagram illustrating a pixel according to a third embodiment of the present invention. For the convenience of explaining FIG. 9, the same components as in FIG. 3 are designated by the same reference numerals and the detailed description is not provided.

Referring to FIG. 9, the pixel 140 according to the third embodiment of the present invention includes an organic light emitting diode OLED and a pixel circuit 142" for controlling an amount of current supplied to the organic light emitting diode OLED.

The anode electrode of the organic light emitting diode OLED is electrically coupled to the pixel circuit 142" and the cathode electrode is electrically coupled to a second power supply ELVSS. The organic light emitting diode OLED produces light (e.g., light with predetermined luminance) in response to the current supplied from the pixel circuit 142".

The pixel circuit 142" is charged with a voltage corresponding to the data signal and the threshold voltage of the driving transistor, and controls the amount of current supplied to the organic light emitting diode OLED on the basis of (e.g., in accordance with) the charge voltage. For this operation, the pixel circuit 140" includes a first transistor M1, a second transistor M2', a fourth transistor M4, and a storage capacitor Cst.

A first electrode of the second transistor M2' is electrically coupled to a second electrode of the first transistor M1 and a second electrode of the second transistor M2' is electrically coupled to a first terminal of the storage capacitor Cst. Further, a gate electrode of the second transistor M2' is electrically coupled to the first scan line S1$n$. The second transistor M2' is turned on and diode-connects (or diode-couples) the first transistor M1 when a first scan signal is supplied to the first scan line S1$n$.

The fourth transistor M4 is located between the data line Dm and the first electrode of the first transistor M1. The fourth transistor M4 is electrically coupled to the second scan line S2$n$. The fourth transistor M4 is turned on and electrically couples the first transistor M1 with the data line Dm when a second scan signal is supplied to the second scan line S2$n$.

Figure 10:
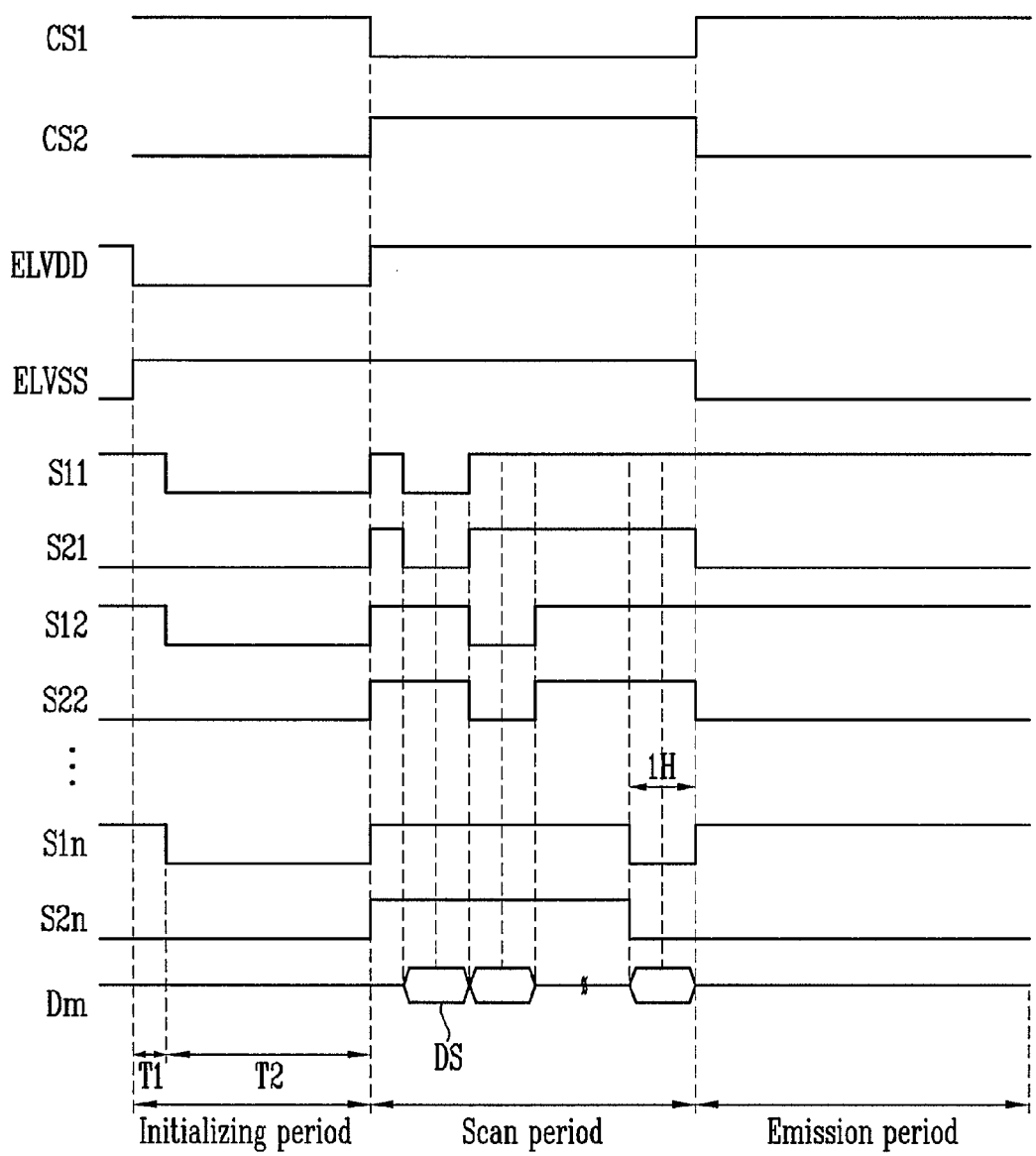
FIG. 10 is a waveform diagram illustrating a method of driving the connecting unit and pixel shown in FIG. 9.

In one embodiment, the scan driver 110, as shown in FIG. 10, concurrently (e.g., simultaneously) supplies the first scan signals to the first scan lines S11 to S1$n$ for (e.g., during) the initializing period and the second period T2 and sequentially supplies the first scan signals to the first scan lines S11 to S1$n$ for the scan period. The sequentially supplied first scan signals are supplied for (e.g., during) a 1H period.

Further, the scan driver 110 supplies the second scan signals to the second scan lines S21 and S2$n$ for (e.g., during) the initializing period and the emission period, and sequentially supplies the second scan signals to the second scan lines S21 to S2$n$ in synchronization with the first scan signals for (e.g., during) the scan period. In this configuration, the second scan signal supplied to the i-th (i is a natural number) second scan line S2$i$ for (e.g., during) the scan period is concurrently (e.g., simultaneously) supplied with the first scan signal supplied to the i-th scan line S1$i$.

FIG. 10 is a waveform diagram illustrating a method of driving the connecting unit and pixel shown in FIG. 9. The waveform shown in FIG. 10 is substantially the same as the waveform shown in FIG. 5, except for the waveforms supplied to the first scan lines S11 to S1$n$ and the second scan lines S21 to S2$n$.

Referring to FIG. 10, the second power supply ELVSS is set to a high level and the first power supply ELVDD is set to a low level for (e.g., during) the initializing period. Further, the second control signal CS1 is supplied and the second control transistor CM2 is turned on and the fourth transistor M4 is turned on by the second scan signal supplied to the second scan line S2$n$, for (e.g., during) the first period T1. As the second control transistor CM2 and the fourth transistor M4 are turned on, the first electrode of the first transistor M1 is electrically coupled with the first power line 182. In this case, a current (e.g., a predetermined current) flows from the anode electrode of the organic light emitting diode OLED to the first power line 182, and accordingly, the voltage of the anode electrode drops substantially to the voltage of the low-level first power supply ELVDD.

First scan signals are supplied to the first scan lines S11 to S1$n$ for (e.g., during) the second period T2 in the initializing period. As the first scan signals are supplied to the first scan lines S11 to S1$n$, the second transistor M2' is turned on. As the second transistor M2' is turned on, the gate electrode of the first transistor M1 and the anode electrode of the organic light emitting diode OLED are electrically coupled to each other. In this process, the voltage at the gate electrode of the first transistor M1 drops to the voltage of the anode electrode of the organic light emitting diode OLED.

The first scan signals are sequentially supplied to the first scan lines S11 to S1$n$, and the second scan signals are sequentially supplied to the second scan lines S21 to S2$n$. As the first scan signal is supplied to the 1n-th scan line S1$n$, the second transistor M2' is turned on, and as the second scan signal is supplied to the 2n-th scan line S2$n$, the fourth transistor M4 is turned on.

The fourth transistor M4 is turned off before a data signal is supplied to the pixel 140 including the fourth transistor M4. Therefore, the voltage of the anode electrode of the organic light emitting diode OLED maintains the voltage supplied for the initializing period, such that a specific period for decreasing the voltage of the anode electrode of the organic light emitting diode OLED can be removed.

The first transistor M1 is diode-connected (or diode-coupled) when the second transistor M2' is turned on. The data line Dm and the first transistor M1 are electrically coupled to each other, when the fourth transistor M4 is turned on. Since the first control transistor CM1 is turned on for the scan period, a data signal is supplied to the data line Dm. The data signal supplied to the data line Dm is supplied to the first electrode of the first transistor M1 through the fourth transistor M4.

As the first transistor M1 is turned on, a voltage corresponding to the data signal and the threshold voltage of the first transistor M1 is applied to the gate electrode of the first transistor M1. The storage capacitor is charged with the voltage applied to the gate electrode of the first transistor M1.

The second control transistor CM2 is turned on by the second control signal for (e.g., during) the emission period. Further, the first power supply ELVDD is set at a high level and the second power supply ELVSS is set at a low level for (e.g., during) the emission period. The first transistor M1 controls an amount of current flowing from the first power supply ELVDD to the second power supply ELVSS through the organic light emitting diode OLED, in response to the voltage stored in the storage capacitor Cst, for (e.g., during) the emission period.

Figure 11:
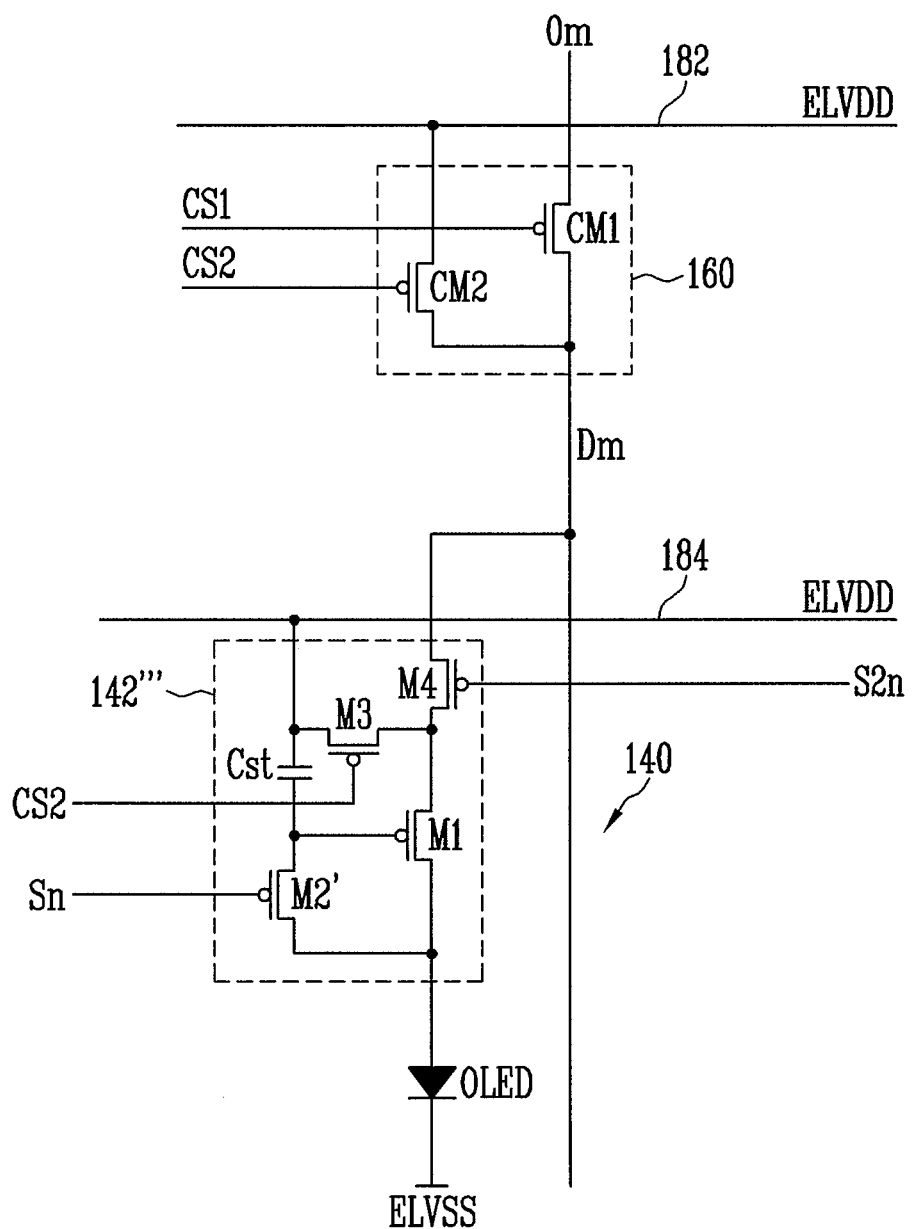
FIG. 11 is a circuit diagram illustrating a pixel according to a fourth embodiment of the present invention.

FIG. 11 is a circuit diagram illustrating a pixel according to a fourth embodiment of the present invention. For the convenience of explaining FIG. 11, the same components as in FIG. 9 are designated by the same reference numerals and the detailed description is not provided.

Referring to FIG. 11, the pixel 140 according to the fourth embodiment of the present invention includes an organic light emitting diode OLED and a pixel circuit 142''' for controlling the amount of current supplied to the organic light emitting diode OLED.

The anode electrode of the organic light emitting diode OLED is electrically coupled to the pixel circuit 142''' and the cathode electrode is electrically coupled to a second power supply ELVSS. The organic light emitting diode OLED produces light (e.g., light with predetermined luminance) in response to the current supplied from the pixel circuit 142'''.

The pixel circuit 142'' is charged with a voltage corresponding to the data signal and the threshold voltage of the driving transistor, and controls the amount of current supplied to the organic light emitting diode OLED on the basis of (e.g., in accordance with) the charge voltage. For this operation, the pixel circuit 140 includes first to fourth transistors M1, M2', M3, M4 and the storage capacitor Cst.

The third transistor M3 is located between a second terminal of the storage capacitor Cst and the first electrode of the first transistor M1. The third transistor M3 is supplied with the second control signal CS2, as shown in FIG. 10, from the control signal generator 170. That is, the third transistor M3 is turned on and reduces or minimizes a voltage drop of the first power supply ELVDD for (e.g., during) the initializing period and the emission period.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A pixel comprising: an organic light emitting diode; a first transistor having a second electrode directly coupled to a data line; a second transistor directly coupled to a gate electrode and the second electrode of the first transistor and configured to be turned on when a scan signal is supplied to a scan line; and a storage capacitor directly coupled between the gate electrode of the first transistor and a first power supply.

2. The pixel as claimed in claim 1, further comprising a third transistor between the first power supply and the data line and configured to be turned on while current is supplied to the organic light emitting diode.

3. The pixel as claimed in claim 1, further comprising a fourth transistor between the data line and the first transistor and configured to be turned on concurrently with the second transistor while the storage capacitor is being charged.

4. An organic light emitting display device that operates in a frame period comprising an initializing period, a scan period, and an emission period, the organic light emitting display device comprising: a display unit including pixels coupled with first scan lines and data lines; a data driver for driving output lines; a first power driver for supplying a first power that varies between a high level and a low level to a first power line and a second power line directly coupled with the pixels; connecting units positioned between the output lines and the data lines and connecting the data lines with any one of the first power line and the output lines; and a second power driver for supplying a second power that varies between a low level and a high level to the pixels, wherein each of the pixels comprises: a first transistor having a second electrode directly coupled with the organic light emitting diode and a first electrode directly coupled to a corresponding one of the data lines; a second transistor directly coupled to a gate electrode and the second electrode of the first transistor and configured to be turned on when a scan signal is supplied to a corresponding one of the first scan lines; and a storage capacitor directly coupled between the gate electrode of the first transistor and the first power driver.

5. The organic light emitting display device as claimed in claim 4, wherein the second power driver is configured to supply a voltage at a high level for the initializing period and the scan period, and to supply a voltage at a low level for the emission period.

6. The organic light emitting display device as claimed in claim 4, further comprising a scan driver configured to concurrently supply first scan signals, to the first scan lines for a period of the initializing period.

7. The organic light emitting display device as claimed in claim 6, wherein each of the pixels further comprises a fourth transistor between the data line and the first transistor and configured to be turned on when a second scan signal is supplied to the second scan line.

8. The organic light emitting display device as claimed in claim 7, wherein the scan driver is configured to supply the second scan signals to second scan lines for the initializing period and the emission period.

9. The organic light emitting display device as claimed in claim 7, wherein the scan driver is configured to sequentially supply the first scan signals and the second scan signals, respectively, to the first scan lines and second scan lines for the scan period.

10. The organic light emitting display device as claimed in claim 7, wherein each of the pixels further comprises a third transistor between the first power line and the data line.

11. The organic light emitting display device as claimed in claim 10, wherein the third transistor is configured to be turned on for the initializing period and the emission period.

12. The organic light emitting display device as claimed in claim 4, wherein each of the connecting units comprises:
   a first control transistor between a corresponding one of the output lines and a corresponding one of the data lines and configured to be turned on when a first control signal is supplied; and
   a second control transistor between the first power line and the corresponding one of the data lines and configured to be turned on when a second control signal is supplied.

13. The organic light emitting display device as claimed in claim 12, wherein the first control transistor and the second control transistor are alternately turned on and off.

14. The organic light emitting display device as claimed in claim 12, further comprising a control signal generator for supplying the second control signals for the initializing period and the emission period, and alternately supplying the first control signals and the second control signals for the scan period.

15. The organic light emitting display device as claimed in claim 14, wherein the scan period includes a plurality of horizontal periods, the second control signals are supplied for a first half period of the horizontal periods, and the first control signals are supplied for a second half period, except for the first half period.

16. The organic light emitting display device as claimed in claim 15, further comprising a scan driver for supplying the scan signals to the first scan lines in synchronization with the first control signals for the scan period.

17. The organic light emitting display device as claimed in claim 15, wherein the first power driver is configured to supply a voltage of a low level for the initializing period, to supply a voltage of a low level for the emission period, to supply a voltage of a low level for the first half period of the scan period, and to supply a voltage of a high level for the second half period.

18. The organic light emitting display device as claimed in claim 15, wherein the data driver is configured to supply data signals to the data lines in synchronization with the first control signals.

19. The organic light emitting display device as claimed in claim 12, further comprising a control signal generator for supplying the second control signals for the initializing period and the emission period, and for supplying the first control signals for the scan period.

20. The organic light emitting display device as claimed in claim 19, wherein the first power driver is configured to supply a voltage at a low level for the initializing period, and to supply a voltage at a high level for the scan period and the emission period.

21. The organic light emitting display device as claimed in claim 19, wherein the scan period further comprises a plurality of horizontal periods, and wherein the organic light emitting display device further comprises a scan driver for supplying first scan signals for a second half period of the horizontal periods.

22. The organic light emitting display device as claimed in claim 21, wherein the data driver is configured to supply data signals to the data lines for the second half period of the horizontal period and to supply an initialization power to the data lines for a first half period before the second half period.

23. The organic light emitting display device as claimed in claim 22, wherein the initialization power is set at a voltage lower than a voltage of the data signals.

24. The organic light emitting display device as claimed in claim 4, wherein each of the pixels further comprises a third transistor between the first power line and the data line.

25. The organic light emitting display device as claimed in claim 24, wherein the third transistor is configured to be turned on for the emission period.

* * * * *